(12) United States Patent
Macor et al.

(10) Patent No.: US 11,560,398 B2
(45) Date of Patent: Jan. 24, 2023

(54) ORGANIC ELECTROLUMINESCENT MATERIALS AND DEVICES

(71) Applicant: Universal Display Corporation, Ewing, NJ (US)

(72) Inventors: Joseph A. Macor, Morrisville, PA (US); Geza Szigethy, Newtown, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 382 days.

(21) Appl. No.: 16/859,226

(22) Filed: Apr. 27, 2020

(65) Prior Publication Data

US 2020/0354390 A1      Nov. 12, 2020

Related U.S. Application Data

(60) Provisional application No. 62/844,364, filed on May 7, 2019.

(51) Int. Cl.
    *C07F 15/00* (2006.01)
    *H01L 51/00* (2006.01)

(52) U.S. Cl.
    CPC .......... *C07F 15/0033* (2013.01); *H01L 51/00* (2013.01); *H01L 51/0085* (2013.01)

(58) Field of Classification Search
    CPC ................................................. C07F 15/0033
    See application file for complete search history.

(56) References Cited

U.S. PATENT DOCUMENTS

| 4,769,292 A | 9/1988 | Tang et al. |
| 5,061,569 A | 10/1991 | VanSlyke et al. |
| 5,247,190 A | 9/1993 | Friend et al. |

(Continued)

FOREIGN PATENT DOCUMENTS

| EP | 0650955 | 5/1995 |
| EP | 2034538 | 3/2009 |

(Continued)

OTHER PUBLICATIONS

G. Wyllie et al., 102 Chemical Reviews, 1067-1089 (2002) (Year: 2002).*

(Continued)

*Primary Examiner* — Alexander R Pagano
(74) *Attorney, Agent, or Firm* — Duane Morris LLP

(57) ABSTRACT

Provided is a process for preparation of a compound of Formula 1

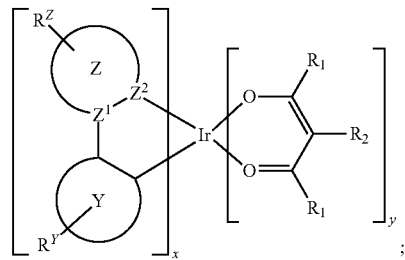

where, ring Y and ring Z are each independently a 5-membered or 6-membered carbocyclic or heterocyclic ring; $Z^1$ and $Z^2$ are each independently C or N; each $R^Y$ and $R^Z$ independently represents mono to the maximum possible number of substitutions, or no substitution; x=1, 2, or 3; y=0, 1, or 2; and x+y=3. Disclosed is a chemical synthesis process that involves contacting a compound of Formula 2

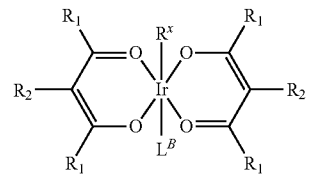

with a compound of Formula 3

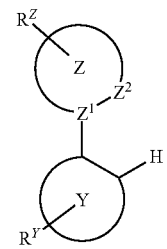

in an organic solvent to yield a compound of Formula 1

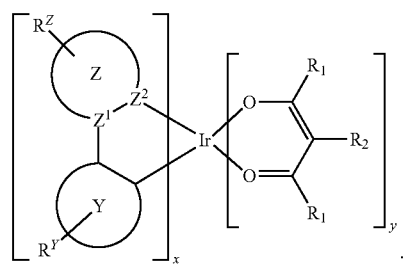

20 Claims, No Drawings

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 10,538,543 | B2 | 1/2020 | Konno et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2010/0148663 | A1* | 6/2010 | Tsai ............... C09K 11/06 546/10 |

FOREIGN PATENT DOCUMENTS

| | | |
|---|---|---|
| JP | 200511610 | 1/2005 |
| JP | 2008074939 | 4/2008 |
| WO | 03060956 | 7/2003 |
| WO | 2005030900 | 4/2005 |
| WO | 2006009024 | 1/2006 |
| WO | 2006072002 | 7/2006 |
| WO | 2006098120 | 9/2006 |
| WO | 2006103874 | 10/2006 |
| WO | 2007004380 | 1/2007 |
| WO | 2007063754 | 6/2007 |
| WO | 2008101842 | 8/2008 |
| WO | 2009003898 | 1/2009 |
| WO | 2009063833 | 5/2009 |
| WO | 2009100991 | 8/2009 |
| WO | 2018/079275 | 5/2018 |

OTHER PUBLICATIONS

R. Holz et al., 27 Inorganic Chemistry, 4640-4644 (1988) (Year: 1988).*

A. Cassol et al., J. Chem. Soc. Dalton Trans. 469-474 (1992) (Year: 1992).*

IUPAC. Compendium of Chemical Terminology, 2nd ed. "dipolar bond" (the "Gold Book") (2019) (Downloaded from https://goldbook.iupac.org/terms/view/D01752 on Aug. 2, 2021) (Year: 2019).*

G. Bhalla et al., 127 Journal of the American Chemical Society, 11372-11389 (2005) (Year: 2005).*

Bhalla, Gaurav et al., "Synthesis, Structure, and Reactivity of O-Donor Ir(III) Complexes: C—H Activation Studies with Benzene", J. Am. Chem. Soc. 2005, 127, 11372-11389.

Chang, Qiao-Wen et al., "Crystal structure of bis(acetylacetonato-!20,O')-(diacetylmethanido-!C)(acetonitrile-N)iridium(III) sesquihydrate,Ir(C5H7O2)3(CH3CN) • 1.5H2O", Z. Kristallogr. NCS 225 (2010) 667-668 / DOI 10.1524/ncrs.2010.0292.

Chang, Qiao-Wen et al., "Crystal structure of bis(acetylacetonato-)20,O')-(diacetylmethanido-)C)-(3-hydroxypyridine)iridium(III) dihydrate, Ir(C5H7O2)3(C5H5NO) • 2H2O", Z. Kristallogr. NCS 226 (2011) 359-360 / DOI 10.1524/ncrs.2011.0161.

Bischof, Steven M. et al., "Benzene C—H Bond Activation in Carboxylic Acids Catalyzed by O-Donor Iridium(III) Complexes: An Experimental and Density Functional Study", Organometallics 2010, 29, 742-756, DOI: 10.1021/om900036j.

Chang, Q. et al., "Crystal Structure of Ir(acac-O,O)2(acac-C3)(Pyridine)", Journal of Structural Chemistry. Vol. 52, No. 4, pp. 824-827, 2011.

Adachi, Chihaya et al., "High-Efficiency Red Electrophosphorescence Devices," Appl. Phys. Lett., 78(11)1622-1624 (2001).

Hung, L.S. et al., "Anode Modification in Organic Light-Emitting Diodes by Low-Frequency Plasma Polymerization of CHF3," Appl. Phys. Lett., 78(5):673-675 (2001).

Palilis, Leonidas C., "High Efficiency Molecular Organic Light-Emitting Diodes Based On Silole Derivatives And Their Exciplexes," Organic Electronics, 4:113-121 (2003).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/844,364, filed on May 7, 2019, the entire contents of which are incorporated herein by reference.

FIELD

The present disclosure generally relates to synthesis of organometallic compounds.

BACKGROUND

Because processes for synthesizing organic compounds used in the fabrication of organic light emitting devices (OLED) can be complicated and expensive, there is always a need for improved synthesis processes that can provide the desired compounds more efficiently and with high purity. Such improved processes will result in higher yield of the desired compounds.

SUMMARY

Disclosed is a process for the preparation of Ir(III) compounds useful for OLED display applications. The process allows the Ir(III) compounds to be prepared in high purity.

In one aspect, the present disclosure provides a process for preparation of a compound of Formula 1

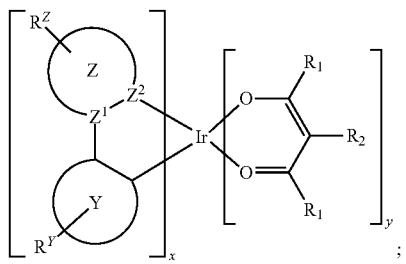

where, ring Y and ring Z are each independently a 5-membered or 6-membered carbocyclic or heterocyclic ring; $Z^1$ and $Z^2$ are each independently C or N; each $R^Y$ and $R^Z$ independently represents mono to the maximum possible number of substitutions, or no substitution; x=1, 2, or 3; y=0, 1, or 2; and x+y=3. The process comprises contacting a compound of Formula 2

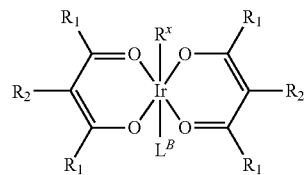

with a compound of Formula 3

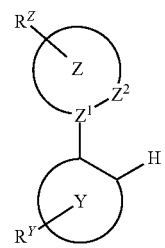

in an organic solvent; where, $L^B$ is a neutral nitrogen-donor ligand; $R^X$ is selected from the group consisting of alkyl, cycloalkyl, heteroalkyl, heterocycloalkyl, aryl, heteroaryl, alkoxy, aryloxy, acyl, alkenyl, cycloalkenyl, heteroalkenyl, alkynyl, and combinations thereof; each $R_1$ is the same or different and is independently selected from the group consisting of alkyl and cycloalkyl; each $R^2$ is the same or different and is selected from the group consisting of hydrogen, alkyl, and cycloalkyl; each $R^Y$ and $R^Z$ is independently a hydrogen or a substituent selected from the group consisting of the general substituents defined herein; any two substituents can be joined or fused to form a ring; and the process is carried out at or above room temperature.

BRIEF DESCRIPTION OF THE DRAWINGS

None.

DETAILED DESCRIPTION

A. Terminology

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —O$R_s$ radical.

The terms "sulfanyl" or "thio-ether" are used interchangeably and refer to a —S$R_s$ radical.

The term "sulfinyl" refers to a —S(O)—$R_s$ radical.

The term "sulfonyl" refers to a —$SO_2$—$R_s$ radical.

The term "phosphino" refers to a —P($R_s$)$_3$ radical, wherein each $R_s$ can be same or different.

The term "silyl" refers to a —Si($R_s$)$_3$ radical, wherein each $R_s$ can be same or different.

The term "boryl" refers to a —B($R_s$)$_2$ radical or its Lewis adduct —B($R_s$)$_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof.

In some instances, the more preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the most preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed. (Reviews)* 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2,2' positions in a biphenyl, or 1,8 position in a naphthalene, as long as they can form a stable fused ring system.

B. The Process of the Present Disclosure

In one aspect, the present disclosure provides a process for preparation of a compound of Formula 1

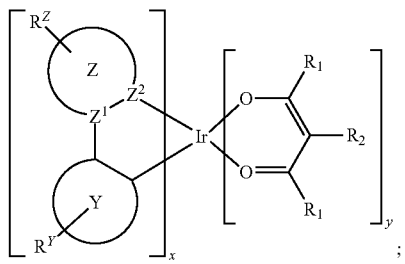

where, ring Y and ring Z are each independently a 5-membered or 6-membered carbocyclic or heterocyclic ring; $Z^1$ and $Z^2$ are each independently C or N; each $R^Y$ and $R^Z$ independently represents mono to the maximum possible number of substitutions, or no substitution; x=1, 2, or 3; y=0, 1, or 2; and x+y=3. The process comprises contacting a compound of Formula 2

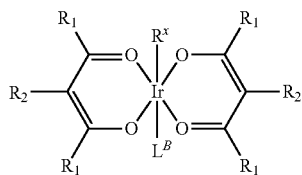

with a compound of Formula 3

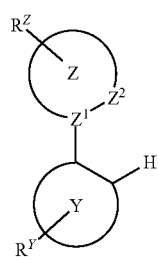

in an organic solvent; where, $L^B$ is a neutral nitrogen-donor ligand; $R^X$ is selected from the group consisting of alkyl, cycloalkyl, heteroalkyl, heterocycloalkyl, aryl, heteroaryl, alkoxy, aryloxy, acyl, alkenyl, cycloalkenyl, heteroalkenyl, alkynyl, and combinations thereof; each $R_1$ is the same or different and is independently selected from the group consisting of alkyl and cycloalkyl; each $R^2$ is the same or different and is selected from the group consisting of hydrogen, alkyl, and cycloalkyl; each $R^Y$ and $R^Z$ is independently a hydrogen or a substituent selected from the group consisting of the general substituents defined herein; any two substituents can be joined or fused to form a ring; and the process is carried out at or above room temperature. The room temperature is the standard room temperature in chemistry which is about 20-25° C.

In some embodiments of the process, a catalytic acid additive can be added to the organic solvent before the contacting step.

In some embodiments of the process, the organic solvent is a substituted or unsubstituted benzene. The substituted benzene can be selected from the group consisting of toluene, xylene, mesitylene, chlorobenzene, dichlorobenzene, trichlorobenzene, dichlorotoluene, dimethylchlorobenzene, and mixtures thereof. One preferred example of a substituted benzene is 1,2-dichlorobenzene.

In some embodiments, the process can be carried out at a temperature that is at least 20° C. In some embodiments, the process can be carried out at a temperature that is at least 70° C. In some embodiments, the process can be carried out at a temperature that is at least 120° C. In some embodiments, the process can be carried out at a temperature that is at least 170° C. In some embodiments, the process can be carried out at a temperature that is at least 200° C. The processing temperature, however, is preferably not higher than 230° C.

In some embodiments of the process, $Z^1$ is C and $Z^2$ is N. In some embodiments, $Z^1$ is N and $Z^2$ is C. In some embodiments, $Z^1$ is N and $Z^2$ is N.

In some embodiments of the process, ring Z is a 6-membered aryl or heteroaryl ring. In some embodiments of the process, ring Z is a 5-membered heteroaryl ring. In some embodiments of the process, ring Y is benzene. In some embodiments of the process, two adjacent $R^Y$ are joined to form a fused ring. In some embodiments of the process, two adjacent substituents, one $R^Y$ and one $R^Z$, are joined to form a ring. In some embodiments of the process, two adjacent substituents, one $R^Y$ and one $R^Z$, are joined to form a ring, the same $R^Z$ and its adjacent another $R^Z$ are joined to form another ring.

In some embodiments of the process, $L^B$ can be a nitrile ligand, an amine ligand, or a heterocyclic ligand. In some embodiments, $L^B$ can be a substituted or unsubstituted imidazole ligand. In some embodiments, $L^B$ can be a substituted or unsubstituted pyridine ligand. In some embodiments, $L^B$ can be selected from the group consisting of pyridine, 2-methylpyridine, 2-chloropyridine, and 3-nitropyridine.

In some embodiments of the process, each $R_1$ is alkyl. In some embodiments, each $R_2$ is hydrogen.

In some embodiments of the process, $R^X$ has Formula 4

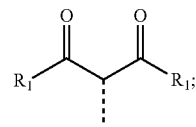

and each $R_1$ can be the same or different.

In some embodiments of the process, each $R_1$ is independently selected from the group consisting of primary alkyl and secondary alkyl.

In some embodiments of the process, each $R_1$ is methyl. In some embodiments, each $R^1$ is 3-pentyl.
In some embodiments of the process, in Formula I, x=3 and y=0. In some embodiments, in Formula I, x=2 and y=1. In some embodiments, in Formula I, x=1 and y=2.
In some embodiments of the process, the compound of Formula 1 comprises a ligand selected from the group consisting of:
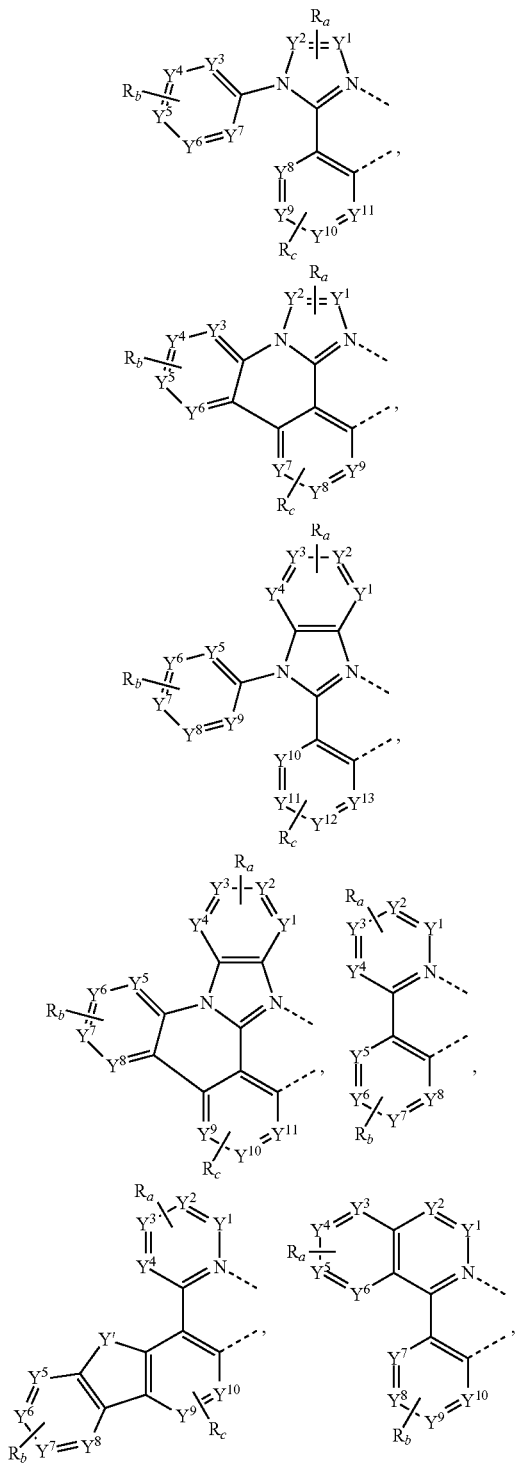
-continued
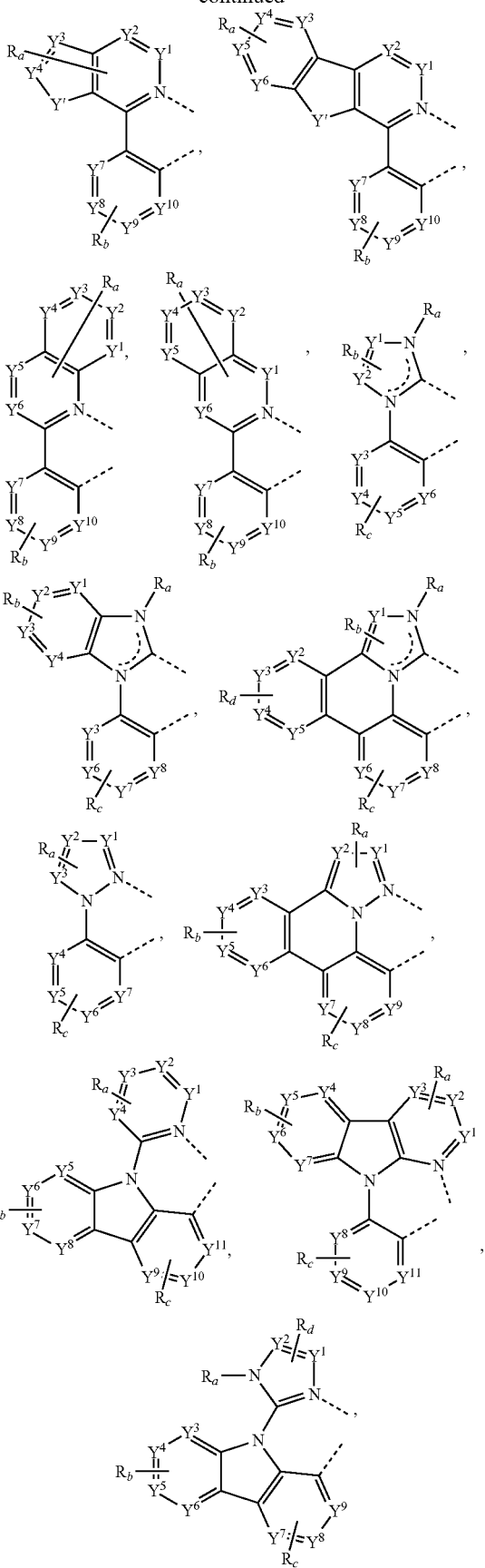

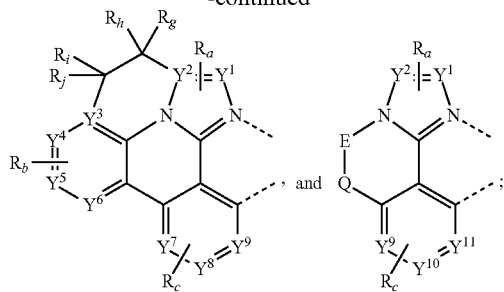

where, each $Y^1$ to $Y^{13}$ are independently selected from the group consisting of carbon and nitrogen; Y' is selected from the group consisting of $BR_e$, $NR_e$, $PR_e$, O, S, Se, C=O, S=O, $SO_2$, $CR_eR_f$, $SiR_eR_f$, and $GeR_eR_f$; Q is selected from the group consisting of $NR_e$, $NR_eR_f$, O, or $CR_eR_f$; E is selected from the group consisting of $CR_eR_f$, $SiR_eR_f$, $BR_e$ or $BR_eR_f$; each $R_a$, $R_b$, $R_c$, and $R_d$ independently represents from mono to the maximum possible number of substitutions, or no substitution; each $R_a$, $R_b$, $R_c$, $R_d$, $R_e$, $R_f$, $R_g$, $R_h$, $R_i$, and $R_j$ is independently a hydrogen or a substituent selected from the group consisting of the general substituents defined herein; and any two adjacent substituents of $R_a$, $R_b$, $R_c$, $R_d$, $R_e$, $R_f$, $R_g$, $R_h$, $R^i$, and $R_j$ are optionally fused or joined to form a ring or form a multidentate ligand.

In some embodiments of the process, the compound of Formula 1 comprises a ligand selected from the group consisting of:

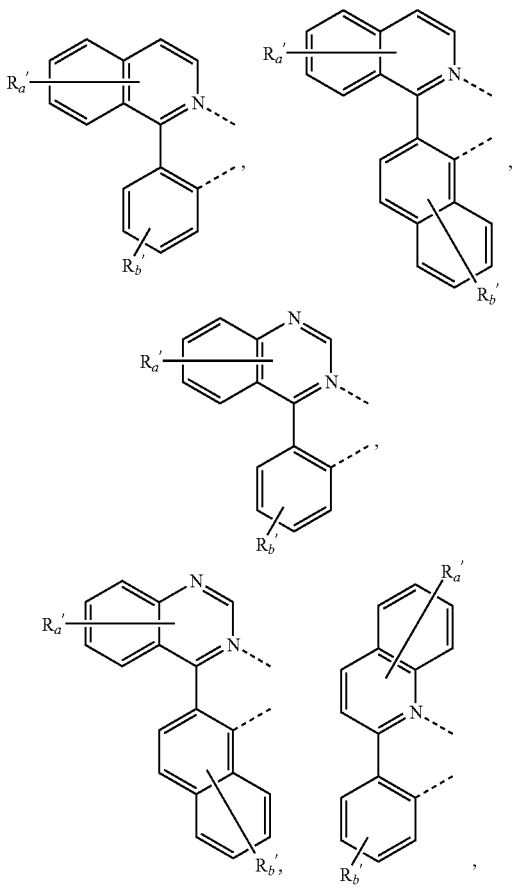

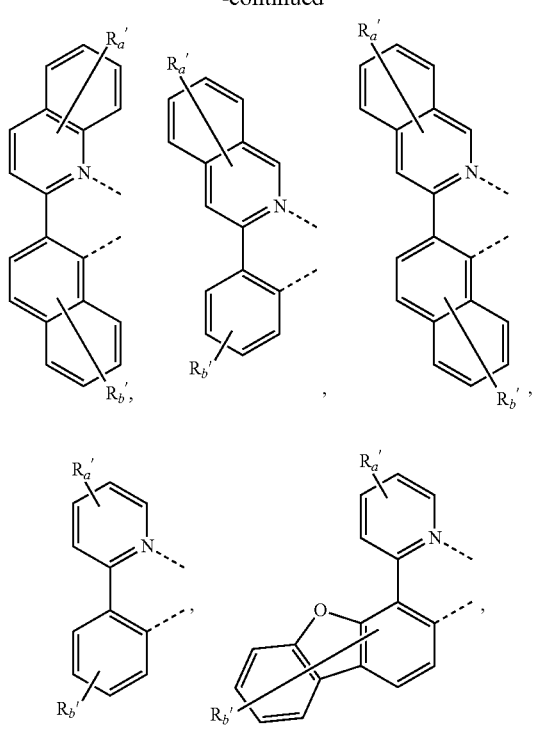

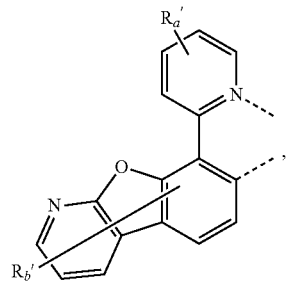

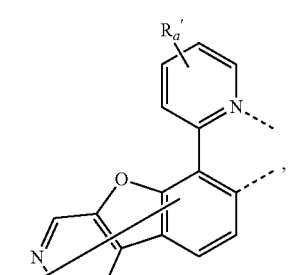

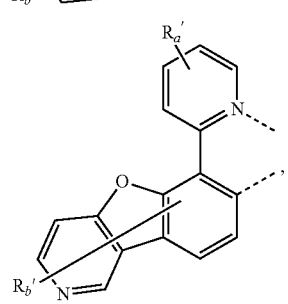

-continued
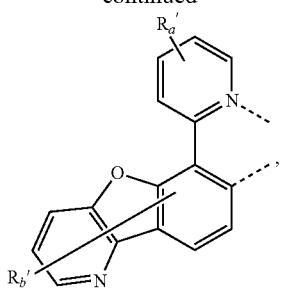
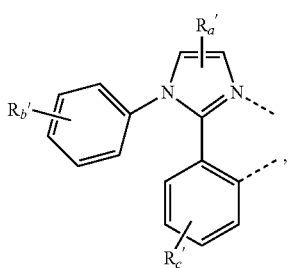
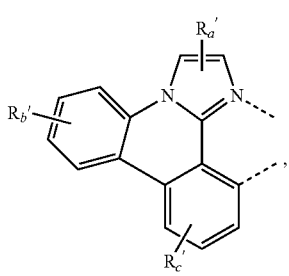
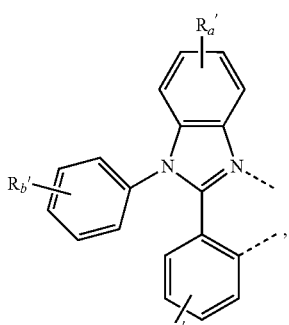
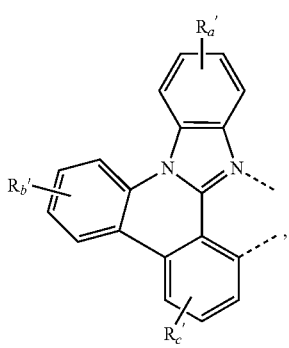
-continued
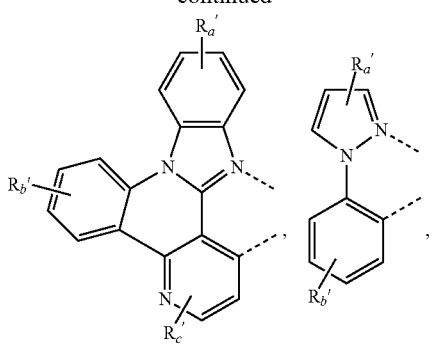
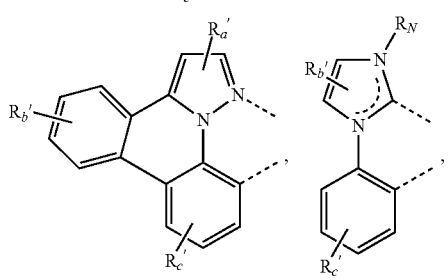
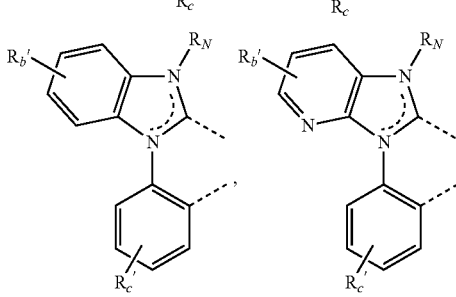
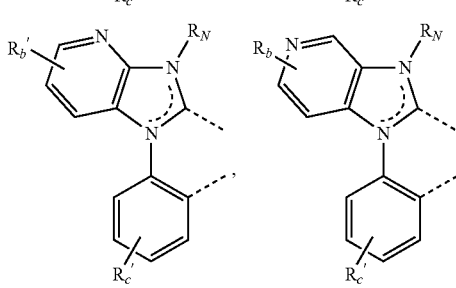
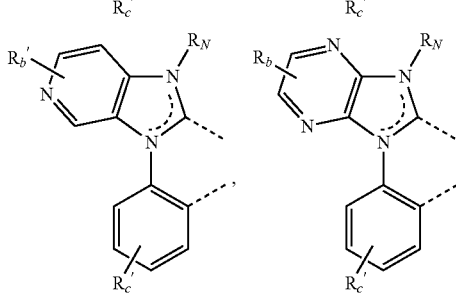
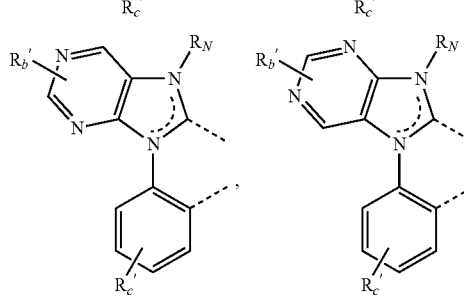

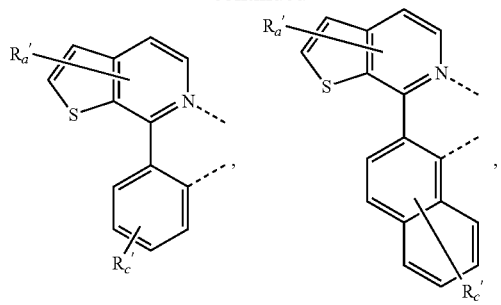
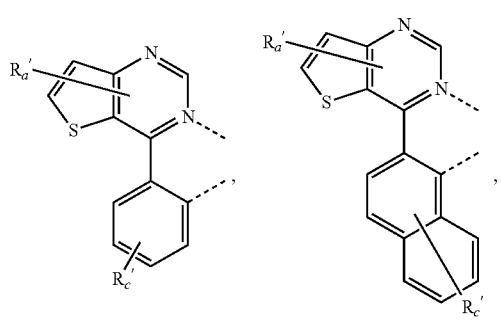
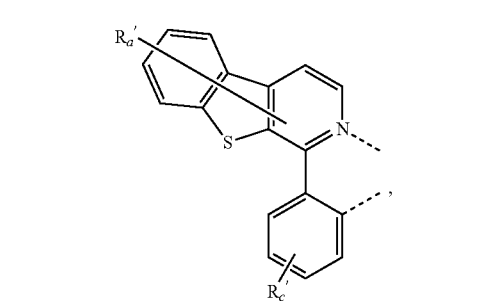
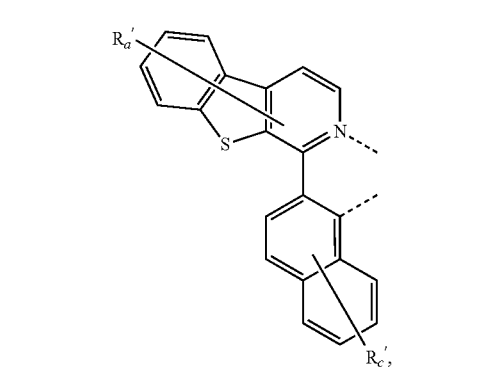
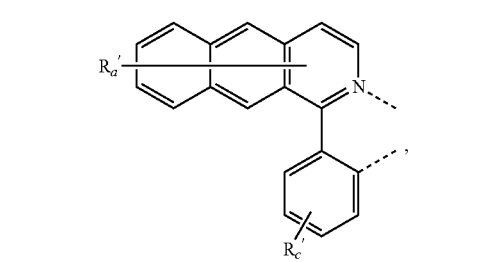
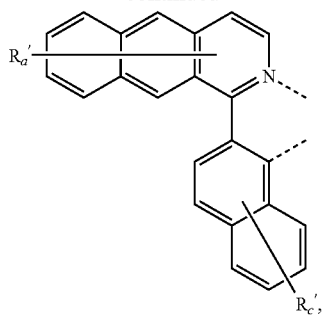
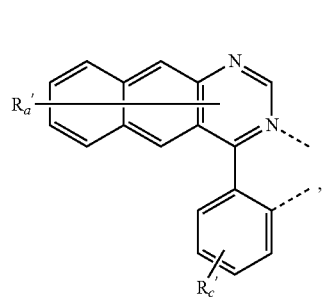
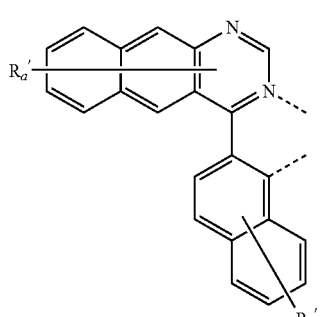
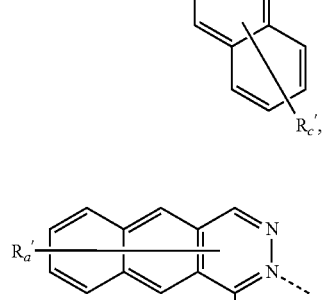
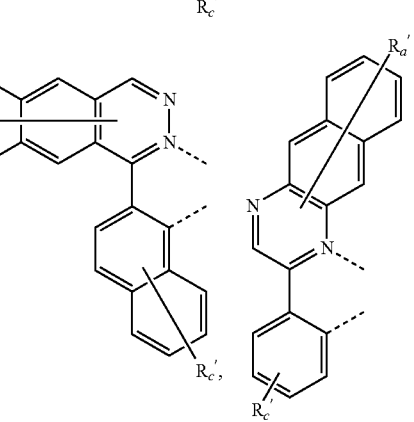

-continued

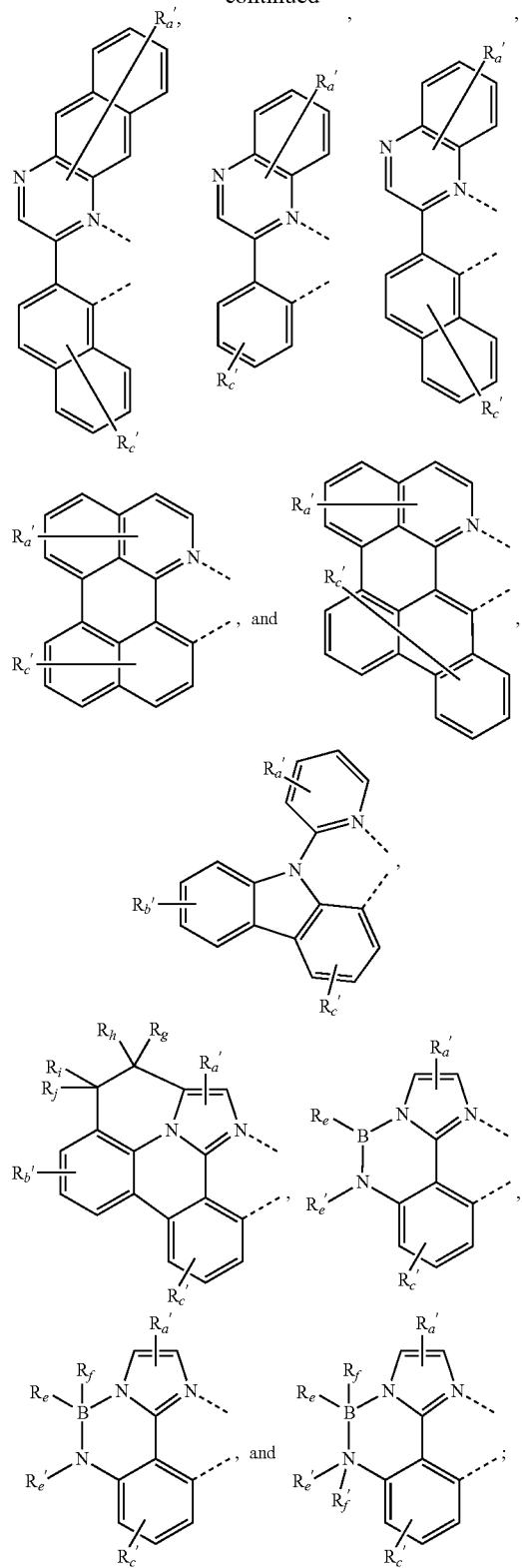

where, $R_a'$, $R_b'$, and $R_c'$ each independently represents mono, up to the maximum allowed number of substitutions to its associated ring, or no substitution; each of $R_N$, $R_a'$, $R_b'$, $R_c'$, $R_e'$, and $R_f$ is independently a hydrogen or a substituent selected from the group consisting of the general substituents defined herein; and any two adjacent substituents can be fused or joined to form a ring or form a multidentate ligand.

EXPERIMENTAL EXAMPLES

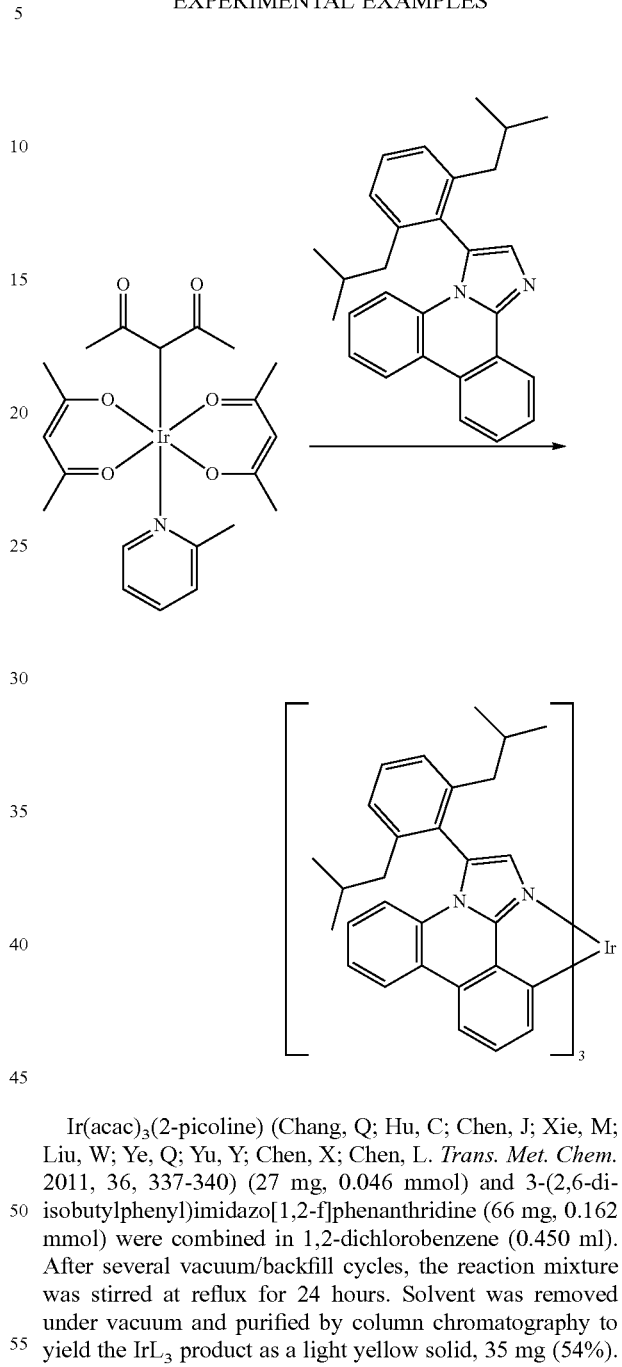

Ir(acac)$_3$(2-picoline) (Chang, Q; Hu, C; Chen, J; Xie, M; Liu, W; Ye, Q; Yu, Y; Chen, X; Chen, L. Trans. Met. Chem. 2011, 36, 337-340) (27 mg, 0.046 mmol) and 3-(2,6-diisobutylphenyl)imidazo[1,2-f]phenanthridine (66 mg, 0.162 mmol) were combined in 1,2-dichlorobenzene (0.450 ml). After several vacuum/backfill cycles, the reaction mixture was stirred at reflux for 24 hours. Solvent was removed under vacuum and purified by column chromatography to yield the IrL$_3$ product as a light yellow solid, 35 mg (54%).

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A process for preparation of a compound of Formula 1

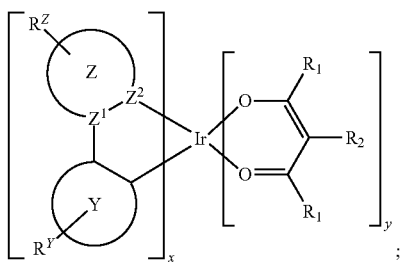

wherein ring Y and ring Z are each independently a 5-membered or 6-membered carbocyclic or heterocyclic ring;
wherein $Z^1$ and $Z^2$ are each independently C or N;
wherein each $R^Y$ and $R^Z$ independently represents mono to the maximum possible number of substitutions, or no substitution;
wherein x=1, 2, or 3;
wherein y=0, 1, or 2;
wherein x+y=3;
the process comprising:
contacting a compound of Formula 2

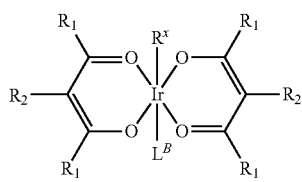

with a compound of Formula 3

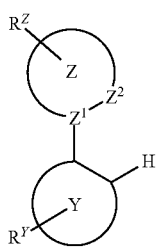

in an organic solvent;
wherein $L^B$ is a neutral nitrogen-donor ligand;
wherein $R^X$ is selected from the group consisting of alkyl, cycloalkyl, heteroalkyl, heterocycloalkyl, aryl, heteroaryl, alkoxy, aryloxy, acyl, alkenyl, cycloalkenyl, heteroalkenyl, alkynyl, and combinations thereof;
wherein each $R_1$ is the same or different and is independently selected from the group consisting of alkyl and cycloalkyl;
wherein each $R_2$ is the same or different and is selected from the group consisting of hydrogen, alkyl, and cycloalkyl;
wherein each $R^Y$ and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof;
wherein any two substituents can be joined or fused to form a ring; and
wherein the process is carried out at or above room temperature.

2. The process of claim 1, further comprising adding a catalytic acid additive to the organic solvent before the contacting step.

3. The process of claim 1, wherein the organic solvent is a substituted or unsubstituted benzene.

4. The process of claim 1, wherein the process is carried out at a temperature that is at least 20° C.

5. The process of claim 1, wherein $Z^1$ is C and $Z^2$ is N.

6. The process of claim 1, wherein $Z^1$ is N and $Z^2$ is C.

7. The process of claim 1, wherein $Z^1$ is N and $Z^2$ is N.

8. The process of claim 1, wherein ring Z is a 6-membered aryl or heteroaryl ring.

9. The process of claim 1, wherein ring Z is a 5-membered heteroaryl ring.

10. The process of claim 1, wherein $L^B$ is a nitrile ligand, an amine ligand, a heterocyclic ligand, a substituted or unsubstituted imidazole ligand, or a substituted or unsubstituted pyridine ligand.

11. The process of claim 1, wherein each $R_1$ is alkyl.

12. The process of claim 1, wherein $R^X$ has Formula 4

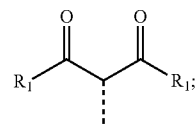

and
wherein each $R_1$ can be the same or different.

13. The process of claim 1, wherein x=3 and y=0.

14. The process of claim 1, wherein x=2 and y=1.

15. The process of claim 1, wherein x=1 and y=2.

16. The process of claim 1, wherein the compound of Formula 1 comprises a ligand selected from the group consisting of:

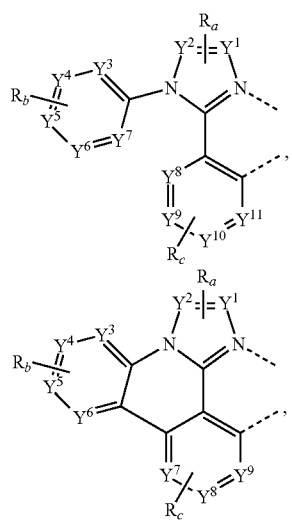

-continued

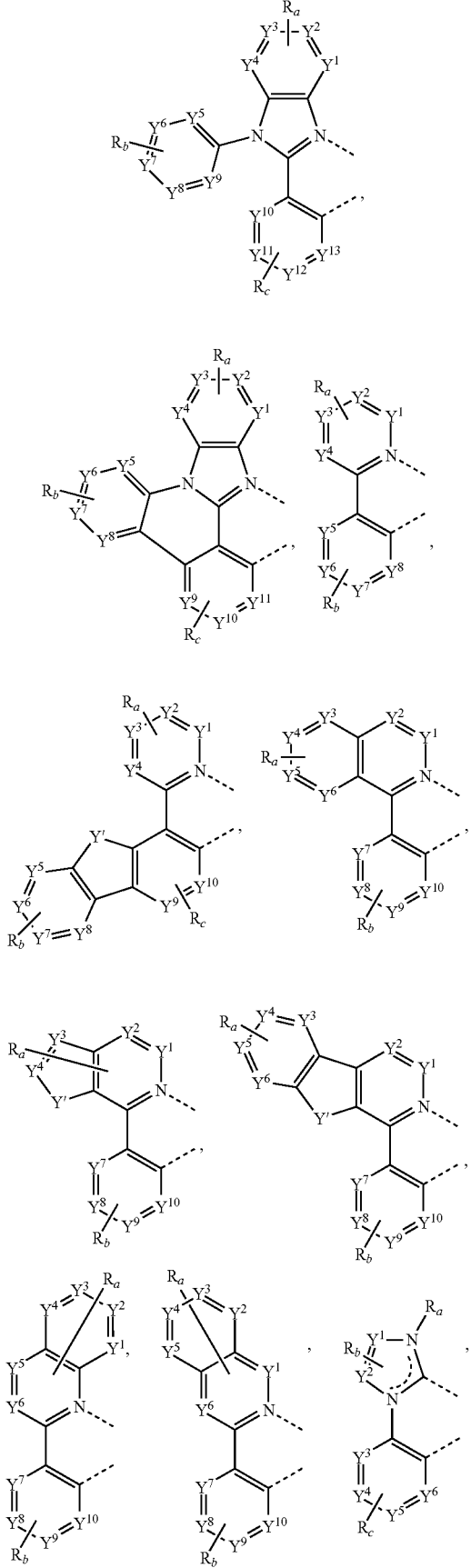

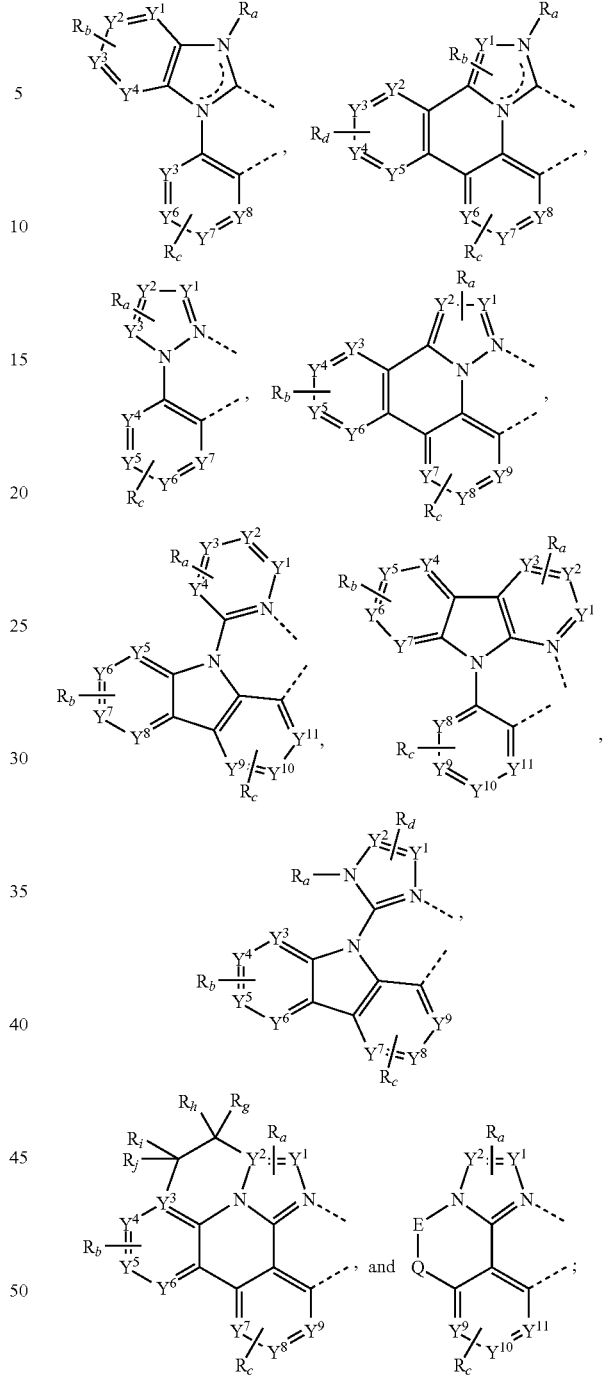

wherein each $Y^1$ to $Y^{13}$ are independently selected from the group consisting of carbon and nitrogen;

wherein Y' is selected from the group consisting of $BR_e$, $NR_e$, $PR_e$, O, S, Se, C=O, S=O, $SO_2$, $CR_eR_f$, $SiR_eR_f$, and $GeR_eR_f$;

wherein Q is selected from the group consisting of $NR_e$, $NR_eR_f$, O, or $CR_eR_f$;

wherein E is selected from the group consisting of $CR_eR_f$, $SiR_eR_f$, $BR_e$ or $BR_eR_f$;

wherein each $R_a$, $R_b$, $R_c$, and $R_d$ independently represents from mono to the maximum possible number of substitutions, or no substitution;

wherein each $R_a$, $R_b$, $R_c$, $R_d$, $R_e$, $R_f$, $R_g$, $R_h$, $R_i$, and $R_j$ is independently a hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

and wherein any two adjacent substituents of $R_a$, $R_b$, $R_c$, $R_d$, $R_e$, $R_f$, $R_g$, $R_h$, $R_i$, and $R_j$ are optionally fused or joined to form a ring or form a multidentate ligand.

17. The process of claim 16, wherein the compound of Formula 1 comprises a ligand selected from the group consisting of:

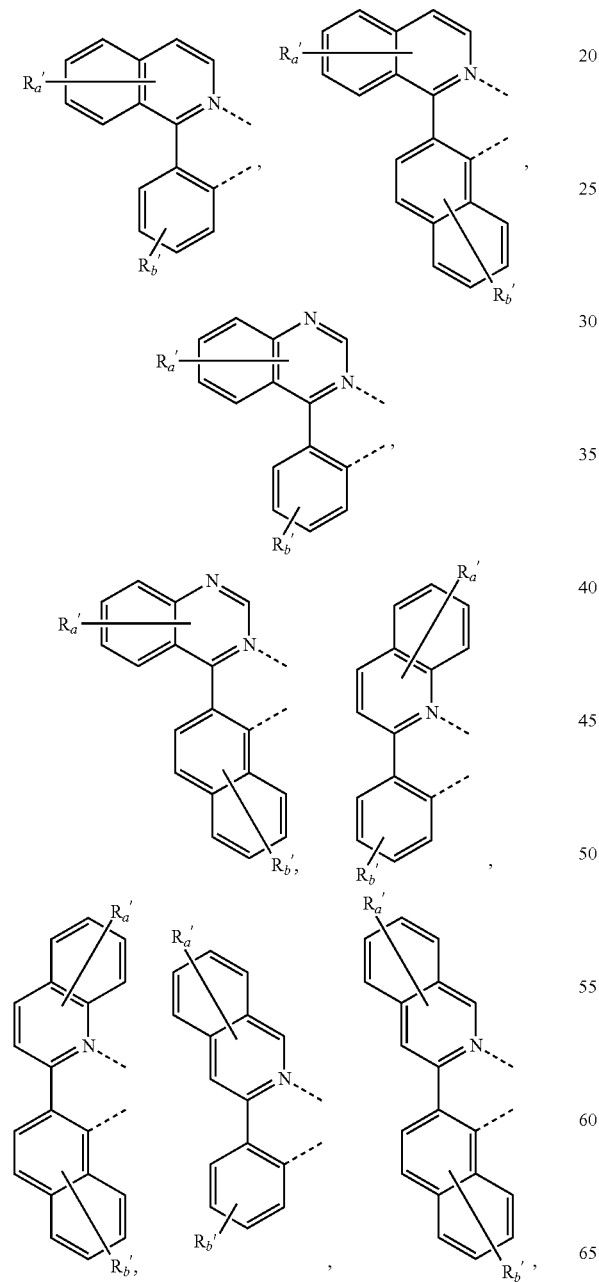

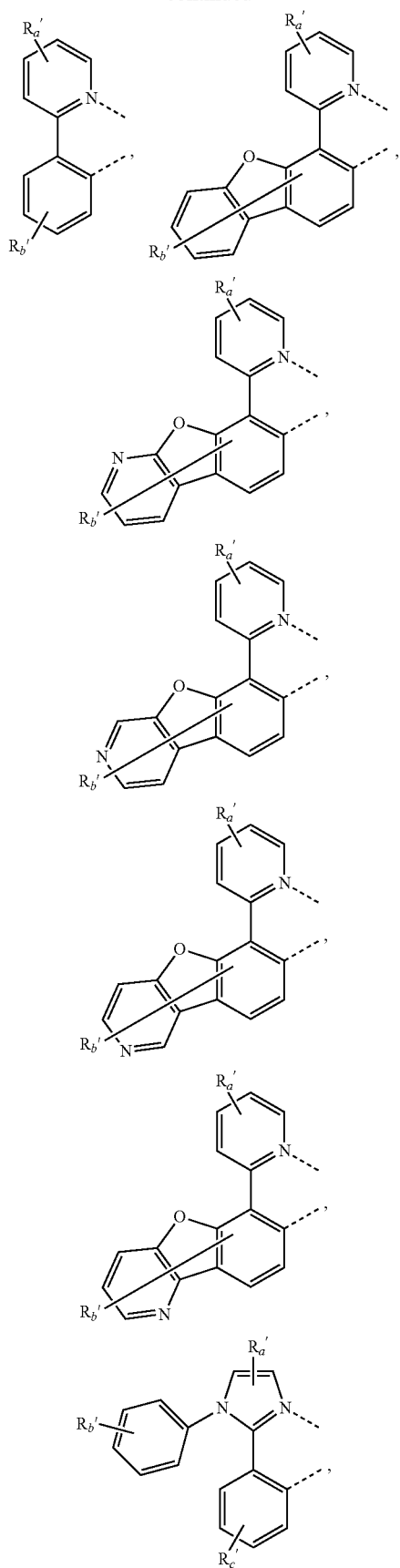

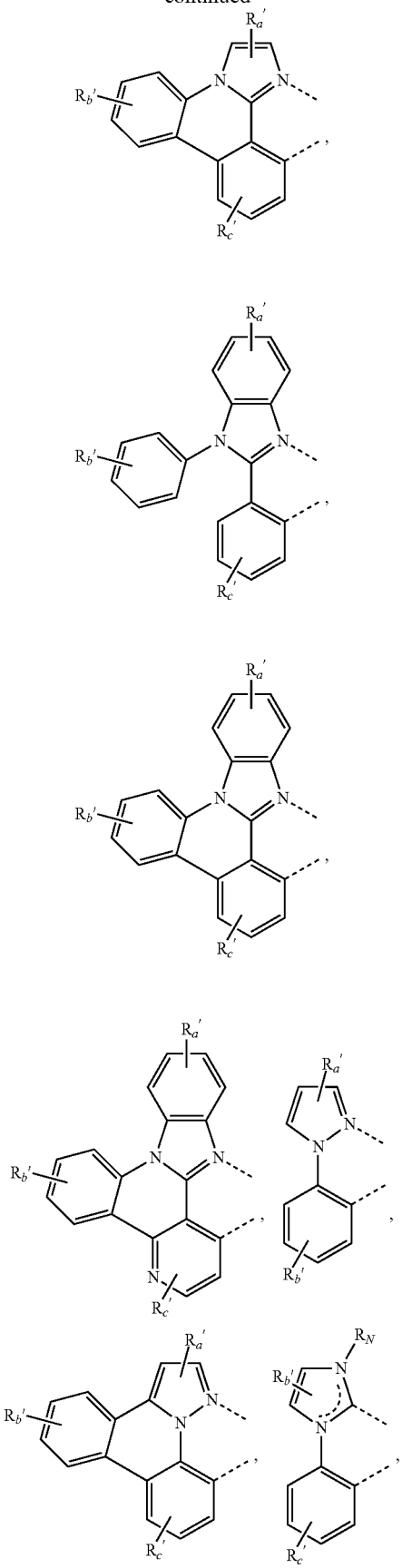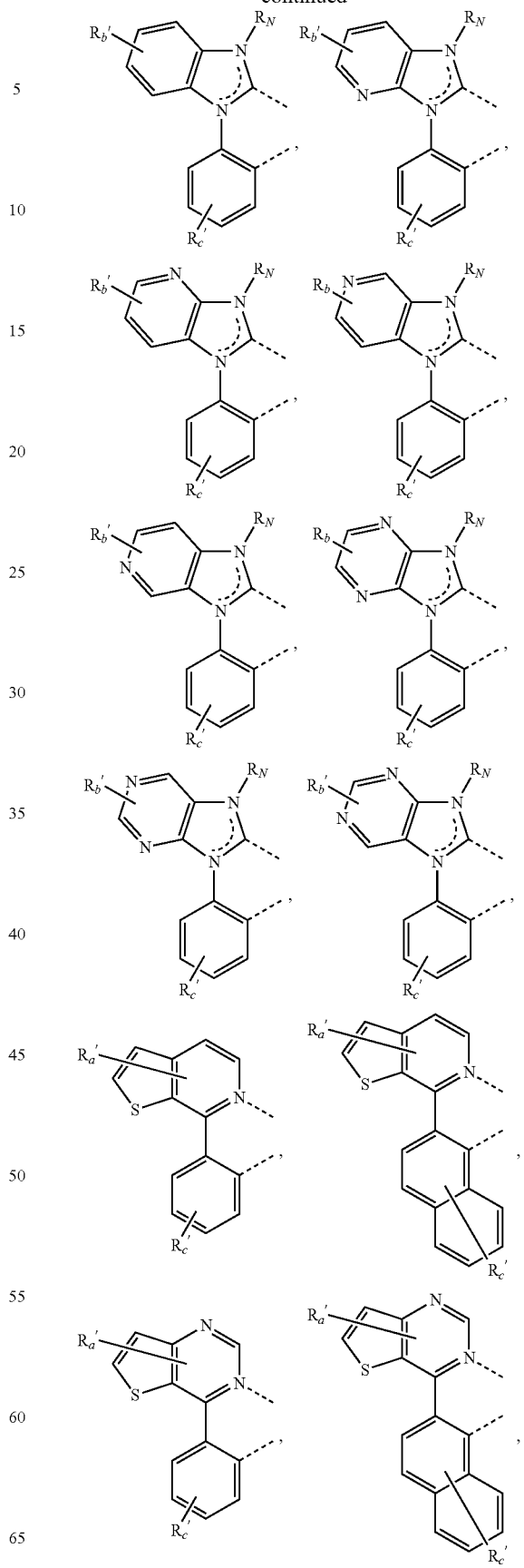

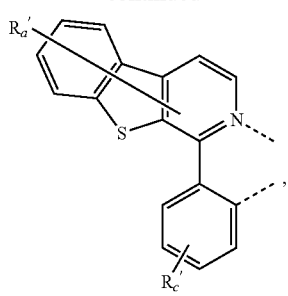
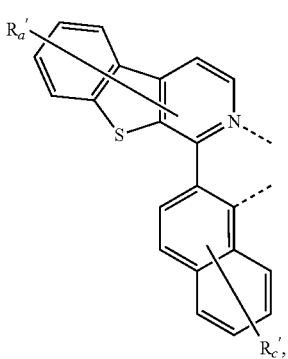
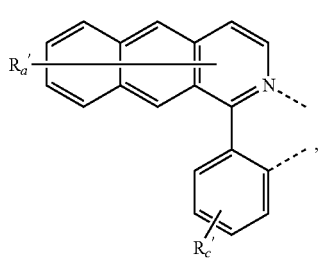
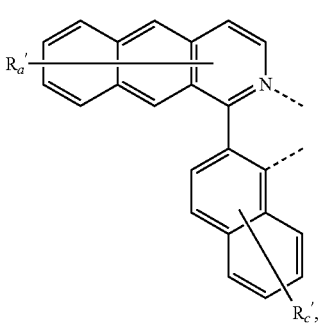
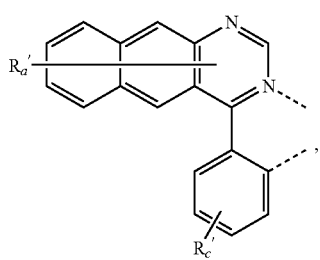
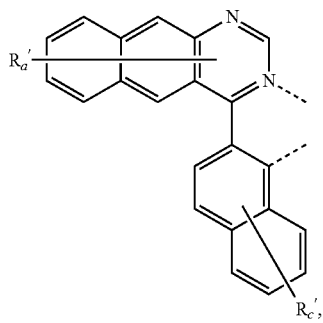
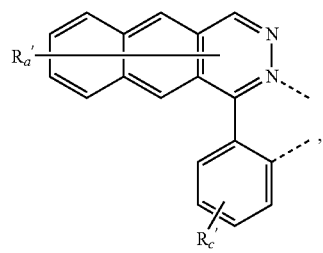
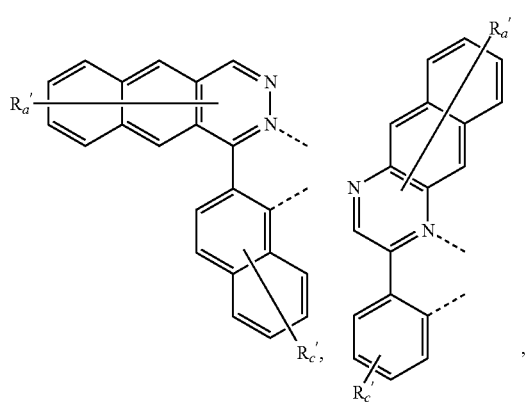
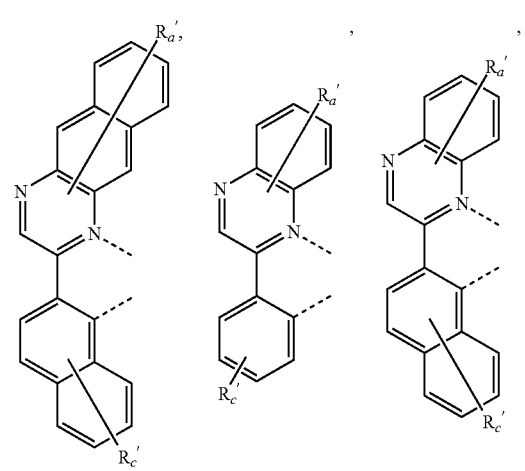

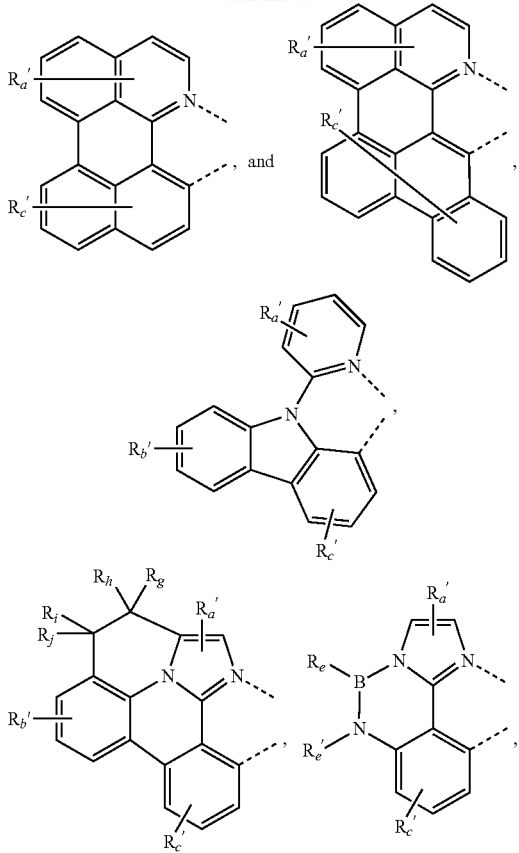

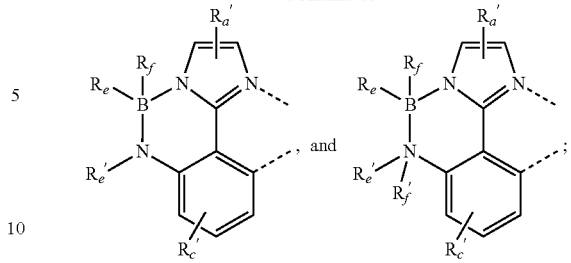

wherein:
$R_a'$, $R_b'$, and $R_c'$ each independently represents mono, up to a maximum allowed number of substitutions to its associated ring, or no substitution;

each of $R_N$, $R_a'$, $R_b'$, $R_c'$, $R_e'$, and $R_f'$ is independently a hydrogen or a substituent selected from the group consisting of deuterium, halide, alkyl, cycloalkyl, heteroalkyl, arylalkyl, alkoxy, aryloxy, amino, silyl, boryl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, boryl, and combinations thereof; and any two adjacent substituents can be fused or joined to form a ring or form a multidentate ligand.

18. The process of claim 1, wherein ring Y is benzene.

19. The process of claim 1, wherein two adjacent substituents, one $R^Y$ and one $R^Z$, are joined to form a ring.

20. The process of claim 1, wherein two adjacent substituents, one $R^Y$ and one $R^Z$, are joined to form a ring, the same $R^Z$ and its adjacent another $R^Z$ are joined to form another ring.

* * * * *